United States Patent [19]
Rolandi et al.

[11] Patent Number: 5,796,275
[45] Date of Patent: Aug. 18, 1998

[54] HIGH VOLTAGES DETECTOR CIRCUIT AND INTEGRATED CIRCUIT USING SAME

[75] Inventors: Paolo Rolandi, Voghera; Massimo Montanaro, Pavia, both of Italy

[73] Assignee: SGS-Thomson Microelectronics S.r.l., Agrate Brianza, Italy

[21] Appl. No.: 791,700

[22] Filed: Jan. 30, 1997

[30] Foreign Application Priority Data

Jan. 31, 1996 [EP] European Pat. Off. ............ 96830043

[51] Int. Cl.$^6$ ............................................. H03K 5/153
[52] U.S. Cl. ........................................ 327/81; 327/80
[58] Field of Search .............................. 327/77, 78, 80, 327/81, 143, 546

[56] References Cited

U.S. PATENT DOCUMENTS

| | | | |
|---|---|---|---|
| 5,083,045 | 1/1992 | Yim et al. | 327/80 |
| 5,118,968 | 6/1992 | Douglas et al. | 327/78 |
| 5,208,488 | 5/1993 | Takiba et al. | 327/546 |
| 5,278,458 | 1/1994 | Holland et al. | 327/77 |
| 5,438,550 | 8/1995 | Kim | 327/143 |

*Primary Examiner*—Toan Tran
*Attorney, Agent, or Firm*—Allen, Dyer, Doppelt, Milbrath & Gilchrist P.A.

[57] ABSTRACT

The circuit, in accordance with the present invention is for detecting the presence at a signal input of a high voltage higher than a predetermined value and signaling it to a signal output through a logical type signal. The circuit comprises one or more first transistors of MOS type and of a predetermined conductivity type, each being diode-connected and having its body terminal connected to the source terminal, and having principal conduction paths connected in series for current conduction between a first node and a ground input. The circuit also includes two or more second transistors of the MOS type and of the same conductivity type, with each one being diode-connected and having its body terminal connected to the source terminal and having principal conduction paths connected in series for current conduction between the signal input and the first node. At least one first logical inverter of the CMOS type has its input connected to the first node and its output coupled to the signal output and is also connected for power supply to a power supply input and to the ground input.

14 Claims, 2 Drawing Sheets

HIGH VOLTAGES DETECTOR CIRCUIT AND INTEGRATED CIRCUIT USING SAME

FIELD OF THE INVENTION

The present invention relates to a circuit for detection of high voltages suited for logical circuit application and sometimes termed a third-level detector.

BACKGROUND OF THE INVENTION

Third-level detection circuits are typically used in CMOS-technology integrated circuits for discriminating between the potential level applied to a terminal normally used by the user, for example for addresses. If this potential is, for example, sufficiently higher than the supply potential or the potential corresponding to the CMOS-technology high logic state, the integrated circuit enables some internal operations and, in general, test operations. This is made possible without the use of additional terminals.

A known and possible manner of providing this detection circuit is shown in the annexed FIG. 1 which comprises: a first transistor N1-1 of the natural NMOS enhancement type being diode-connected and having a source terminal connected to a ground input GND, and a drain terminal connected to a first node ND1; and four second transistors N2-1, N2-2, N2-3, N2-4 of the NMOS enhancement type and each one being diode-connected and having main conduction paths connected in series for current conduction between a signal input IT and the first node ND1. The circuit further includes a first logical inverter of the CMOS type and formed of two transistors M1 and M2 and having an input connected to the first node ND1, and an output connected to a second node ND2. A second logical inverter of the CMOS type is formed of two transistors M3 and M4 and has an input connected to the second node ND2 and an output connected to a signal output OT. Both of the inverters are connected for power to a power supply input VDD and to a ground input GND. This circuit operates as a voltage divider made of non-linear two-terminal circuit elements.

By the term "transistor of the natural MOS type" used above is meant a transistor provided without the channel implantation normally used for realizing transistors belonging to the logic in the integrated circuits. For example, in the case of an N-well process, if the transistor is the natural NMOS type it can have a threshold voltage of 0.5 volts, while if it is the natural PMOS type the voltage threshold will be 1.5 volts, and if it is the normal NMOS or PMOS type, that is, with channel implantation, the voltage threshold will be 1.0 volt.

In this detection circuit the four transistors N2-1 to N2-4 are subject to the "body" effect, that is, the actual threshold voltage is not constant and depends on the square root of the source-body voltage and is thus higher than the "theoretical" value for all the transistors N2-1 to N2-4. In a CMOS process of the N-well type, the body terminals of all the NMOS transistors are connected together to the substrate and thus the transistor N2-4 feels the "body" effect more than the others, since its source-body voltage is greater than that of the others. It is thus important and possible when designing and sizing the circuit of FIG. 1 to allow for this effect. This involves among other things a reduction of the number of the second transistors with respect to the "theoretical" number.

Different detection circuits are known, for example from U.S. Pat. Nos. 4,658,156 and 4,709,172. These detection circuits operate as logical inverters in which to the usual signal input is supplied a fixed power supply or ground potential, and in which the signal to be detected is supplied through non-linear two-terminal circuit elements to the usual power supply or ground input.

During years of experiments there was found imperfect adherence of the real operation with respect to the theoretical operation of the circuit of FIG. 1. Indeed, for equal operating conditions there was sometimes found an undesired low-voltage current leakage and sometimes failed detection at high voltages.

One of the principal causes of this discrepancy has now been identified in the "random" variations of the CMOS manufacturing process, and, in particular, in the variations of the gate oxide thickness. Indeed, this directly effects the theoretical threshold voltage value, as is well known, and indirectly and heavily effects the actual threshold voltage through variation of the body effect as given by the following formula:

$$V_T = V_{T0}(d) + \gamma(d) \cdot (\sqrt{V_{BS} + k2} - \sqrt{k2})$$

in which $V_{BS}$ indicates the body-source voltage, d indicates the oxide thickness, $\tau$ and $k2$ are two constants, $V_T$ is the actual threshold voltage, $V_{T0}$ is the theoretical threshold voltage that is with $V_{BS}=0$. It is noted that it is absolutely uncommon to explicate the dependency of $\tau$ on d and allow therefor when designing circuits and in particular.

$$\gamma(d) = k1 \cdot d$$

SUMMARY OF THE INVENTION

The purpose of the present invention is to supply a detection circuit which would allow for these causes of discrepancies and which would therefore have more reliable operation.

This and other objects, features and advantages of the present invention are provided by a detection circuit comprising: one or more first transistors of MOS type and of a predetermined conductivity type, with each one being diode-connected and having a body terminal connected to a source terminal, the one or more first transistors having principal conduction paths connected in series for current conduction between a first node and a ground input; two or more second transistors of MOS type and of the same predetermined conductivity type as the one or more first transistors, each of the two or more second transistors being diode-connected and having a body terminal connected to a source terminal, the two or more second transistors having principal conduction paths connected in series for current conduction between the signal input and the first node; and at least one first CMOS type logical inverter having an input connected to the first node and an output coupled to the signal output and being connected for power supply to a power supply input and to the ground input.

In accordance with another aspect the present invention also concerns an integrated circuit in which the detection circuit is included and finds advantageous application as an activator of internal test operations.

By using transistors for the divider, each of which has its own body terminal connected to its own source terminal, both in the case of NMOS-type transistors and in the case of PMOS-type transistors, the body effect is virtually canceled out independently of the process variations. In addition, a divider has the advantage of not being in itself sensitive to the power supply voltage variations. It is recalled that, by convention, the source terminal of an NMOS-type transistor is the principal conduction terminal at the lower potential, and the source terminal of a PMOS-type transistor is the principal conduction terminal at the higher potential.

BRIEF DESCRIPTION OF THE DRAWINGS

The present invention is clarified by the following description considered together with the annexed drawings in which.

DETAILED DESCRIPTION OF PREFERRED EMBODIMENTS

Figure 1:
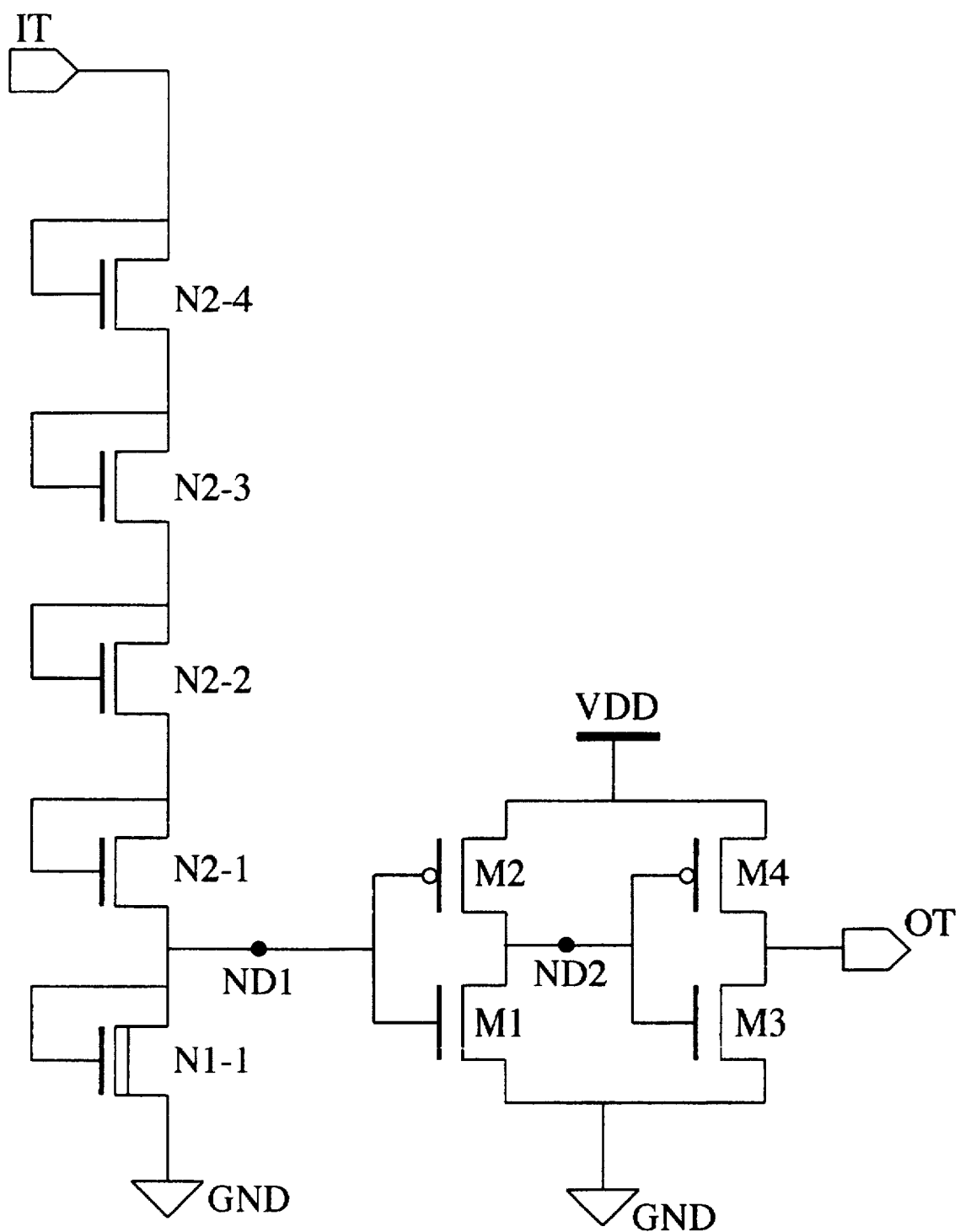
FIG. 1 shows the circuit diagram of a detection circuit in accordance with the prior art.
Figures 2, 3:
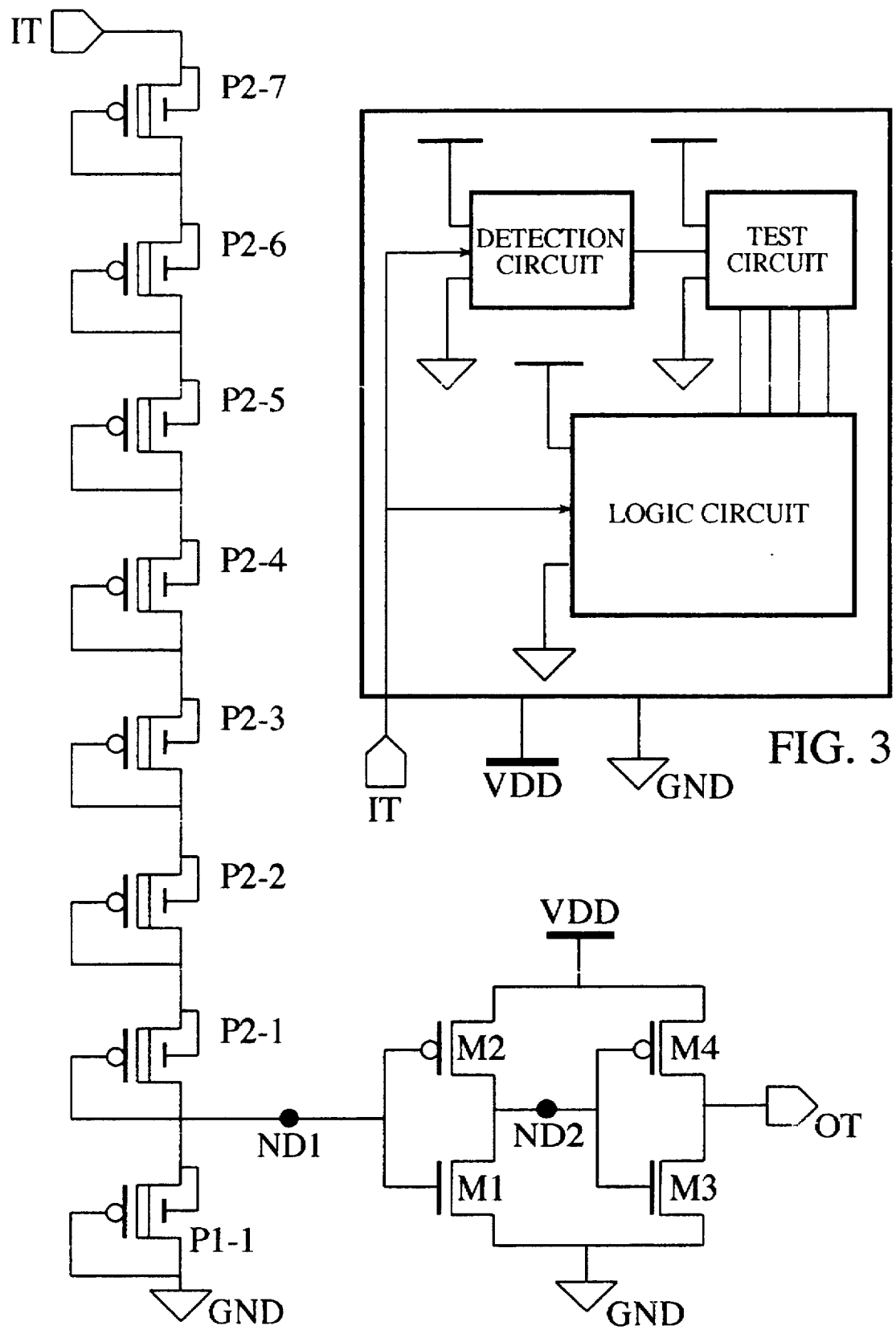
FIG. 2 shows the circuit diagram of a detection circuit in accordance with the present invention.
FIG. 3 shows a block diagram of an integrated circuit in accordance with the present invention.

With reference to FIG. 2, the circuit in accordance with the present invention for detecting the presence at a signal input IT of a high voltage greater than a redetermined value, and signaling it to a signal output OT through a logical-type signal comprises:

(a) one or more first transistors P1-1 of MOS type of a predetermined conductivity type, with each one being diode-connected, and having its body terminal connected to its source terminal, and having principal conduction paths connected in series for current conduction between a first node ND1 and a ground input GND.

(b) two or more second transistors P2-1 to P2-7 of the MOS type of the same predetermined conductivity type, with each one being diode-connected, and having its body terminal connected to its source terminal, and having principal conduction paths connected in series for current conduction between the signal input IT and the first node ND1, and (c) at least one first CMOS type logical inverter formed as illustrated in FIG. 2 of a third transistor M1 and a fourth transistor M2, and having its input connected to the first node ND1 and its output, corresponding to the node ND2, coupled to the signal output OT, and connected for power supply to a power supply input VDD and to the ground input GND.

As already stated, in this manner the body effect is virtually canceled out independent of the process variations. In addition, the divider consisting of the transistors P1-1, and P2-1 to P2-7 has the advantage of not being in itself sensitive to the variations of the power supply voltage to be applied at the input VDD.

As long as the voltage between the input IT and the input GND does not exceed a predetermined value corresponding to the sum of the threshold voltages of all the first and second transistors, the latter are interdicted and hence the current is virtually null. Accordingly, the potential at the node ND1 is virtually equal to the potential at the input GND and the output of the first inverter is at a high logical level. If this predetermined value is exceeded, the transistors P1-1 and P2-1 to P2-7 operate as non-linear circuit elements of a resistive divider, and; thus, the potential which is established at the node ND1 depends on the division ratio. This potential which is established must be sufficiently high that the first inverter switches and its state passes to low logical level to signal the event of interest.

Using transistors all of the same conductivity type for the divider involves a uniform behavior of all the non-linear elements defining the divider, and, hence, ensures constancy of operation with changes in the parameters, such as temperature and process, and also makes correct sizing easier. The fact that the second transistors are at least two in number is the result of the need for detecting high voltages.

The circuit in accordance with the present invention can comprise in addition a second logical inverter of the CMOS type and illustrated in FIG. 2 by a fifth transistor M3 and a sixth transistor M4 having an input connected to the output of the first inverter, node ND2, and an output connected to the signal output OT, and also connected for power supply to the power supply input VDD and to the ground input GND. This second inverter provides a high active output decoupled from the first inverter which operates as a comparator. If the transistor M3 is the NMOS type and the transistor M4 is the PMOS type, and if the W:L ratio of the transistor M3 is approximately equal to the W:L ratio of the transistor M4, the second inverter is suitable for operating as an output stage having a rather low impedance and ensuring good decoupling for the upstream stages.

If all the transistors P1-1 and P2-1 to P2-7 are the natural PMOS type and are provided in type-N wells all distinct to be able to connect the body terminal with the respective source terminal, then the number of transistors necessary to reach the predetermined value is minimal because their threshold voltage is maximum.

If the transistor M1 is the NMOS type and the transistor M2 is the PMOS type, and if the W:L ratio of the transistor M1 is much greater than the W:L ratio of the transistor M2, the release threshold $V_{TH}$ of the first inverter is virtually independent of the supply voltage and is given by the following formula:

$$V_{TH} = \frac{V_{DD} + V_{TP} + V_{TN}\sqrt{B_N/B_P}}{1 + \sqrt{B_N/B_P}}$$

in which VDD is the supply voltage, $V_{TP}$ is the threshold voltage of the PMOS transistors, $V_{TN}$ is the threshold voltage of the NMOS transistors and $B_N$ and $B_P$ are given by the following formulas:

$$B_N = (W/L)_N \cdot k$$

$$B_P = (W/L)_P \cdot k4$$

It is noted that the release threshold $V_{TH}$ tends to coincide with the threshold voltage $V_{TN}$ of the NMOS transistors and is therefore rather low. This helps sizing of the resistive input divider and indeed it is sufficient that the potential of the node ND1 rise little, and, in addition, permits using the circuit even with very low power supply voltages.

On the basis of these considerations it is appropriate to use a single first transistor P1-1 and a number of second transistors P2-1 to P2-7 such that the former and the latter enter into conduction only when the voltage at the signal input IT draws near in rising to the predetermined value. Indeed, in this manner current consumption of the circuit before the intervention is practically null, and switching of the first inverter takes place immediately after emergence from the interdiction, that is, with very low current in the divider, since the threshold voltage of the natural PMOS transistor is higher than the threshold voltage of the normal NMOS transistor of the first inverter.

In accordance with a possible and advantageous choice, the second transistors P2-1 to P2-7 are all the same and the channel width of each second transistor is much greater than the channel width of each first transistor, and the channel length of each second transistor is much less than the channel length of each first transistor. The result is that as soon as conduction of the first and second transistors begins, the second transistors are able to conduct a rather high current which leads rapidly to turn-on of the transistor M1. The division ratio in this case is rather high, for example 0.5.

It is clear that a circuit of this type lends itself particularly well to provision in integrated circuit form preferably in CMOS technology. Naturally the choices of the W:L ratios must also allow for the space occupied by the circuit when it is provided in integrated form.

The embodiment of FIG. 2 of the circuit in accordance with the present invention comprises a first transistor P1-1 of the natural PMOS enhancement type and being diode-connected, and having its body terminal connected to the source terminal, and having its drain terminal connected to a ground input GND. The source terminal is also connected to a first node ND1, seven second transistors P2-1 to P2-7 of the natural PMOS enhancement type with each one being diode-connected, and having its body terminal connected to its source terminal, and having their principal conduction paths connected in series for current conduction between a signal input IT and the first node ND1. A first logical inverter of the CMOS type is made up of two transistors M1 and M2 and has an input connected to the first node ND1 and an output connected to a second node ND2. A second logical inverter of CMOS type is made up of two transistors M3 and M4 and has an input connected to the second node ND2 and an output connected to a signal output OT with both of the inverters being connected for power to a power supply input VDD and to the ground input GND. This circuit operates as a voltage divider made up of non-linear two-terminal circuit elements.

In a specific embodiment the transistors P2-1 to P2-7 are all the same and have a W:L ratio corresponding to 12 µm×1.4 µm. The transistor P1-1 has a W:L ratio corresponding to 4 µm×3 µm. The transistor M1 has a W:L ratio corresponding to 30 µm×1.2 µm, the transistor M2 has a W:L ratio corresponding to 3 µm×3µm, the transistor M3 has a W:L ratio corresponding to 8 µm×0.8 µm, and the transistor M4 has a W:L ratio corresponding to 15 µm×0.9 µm. These choices refer to the case in which a potential of 0 volts to the terminal GND is applied, to the terminal VDD a potential of 6 volts is applied, and the predetermined value which if exceeded causes signaling by the circuit is approximately 12 volts.

The detection circuit in accordance with the present invention finds advantageous application as activator of internal test operations in an integrated circuit, for example such as that shown in FIG. 3, provided in CMOS technology and equipped with a power supply terminal VDD designed to be connected to a power supply potential, a ground terminal GND designed to be connected to a ground potential, and at least one signal input IT. It comprises the following component parts.

(a) logic-type circuitry CC connected to the signal terminal IT, (b) a detection circuit DC in accordance with the present invention designed to detect at the signal input IT a potential higher than the power supply potential, and (c) a test circuit TC connected for activation to the output of the detection circuit DC and designed to test the logic-type circuitry CC.

The terminal IT is used by the circuitry CC to receive data and/or addresses by means of logical potential signals. The logical value 0 can correspond to the fact that this logical signal is at the ground potential, and the logical value 1 can correspond to the fact that the signal is at the power supply potential.

The functionality of the integrated circuit of the CMOS type is increased without the addition of additional terminals. Indeed by applying to the terminal IT signals having a potential higher than the power supply potential, the integrated circuit is capable of detecting such a condition and operating in a different manner. Typically this different operation is related to the test of the circuitry CC. This is used in integrated circuits both for memory and for processing.

We claim:

1. A circuit for detecting a high voltage higher than a predetermined value at a signal input, and signaling the detection to a signal output using a signal of a logical type, the circuit comprising:

one or more first natural transistors of MOS type and of a predetermined conductivity type, with each one being diode-connected and having a body terminal connected to a source terminal, the one or more first transistors having principal conduction paths connected in series for current conduction between a first node and a ground input;

two or more second natural transistors of MOS type and of the same predetermined conductivity type as the one or more first transistors, each of the two or more second transistors being diode-connected and having a body terminal connected to a source terminal, the two or more second transistors having principal conduction paths connected in series for current conduction between the signal input and the first node; and at least one first CMOS type logical inverter having an input connected to the first node and an output coupled to the signal output and being connected for power supply to a power supply input and to the ground input.

2. A circuit in accordance with claim 1 further comprising a second logical inverter of CMOS type having an input connected to the output of said first inverter and an output connected to the signal output, and being connected for power supply to the power supply input and to the ground input.

3. A circuit in accordance with claim 1 wherein all the first and second transistors are the natural PMOS type and are provided in type-N wells all distinct from one another.

4. A circuit in accordance with claim 1 wherein said first inverter comprises a third transistor of NMOS type and a fourth transistor of PMOS type; and wherein a W:L ratio of said third transistor is much greater than a W:L ratio of said fourth transistor.

5. A circuit in accordance with claim 1 wherein said one or more first transistors are one, and the two or more second transistors are a number such that the first and second transistors start conduction only when a voltage at the signal input approaches the predetermined value while rising.

6. A circuit in accordance with claim 1 wherein said two or more second transistors are all the same; wherein a channel width of each second transistor is much greater than a channel width of each first transistor; and wherein a channel length of each second transistor is much less than a channel length of each first transistor.

7. A circuit in accordance with claim 2 wherein said second inverter comprises a fifth transistor of NMOS type and a sixth transistor of PMOS type; and wherein a W:L ratio of said fifth transistor is approximately equal to a W:L ratio of said sixth transistor and is suited for operation as an output stage.

8. A circuit integrated in CMOS technology and comprising a power supply terminal to be connected to a power supply potential, and a ground terminal to be connected to a ground potential and at least one signal terminal, the circuit comprising:
- a logic type circuit connected to the at least one signal terminal;
- a detection circuit for detecting at the at least one signal terminal a potential higher than the power supply potential, said detection circuit comprising
  - one or more first natural transistors of MOS type and of a predetermined conductivity type, with each one being diode-connected and having a body terminal connected to a source terminal, the one or more first transistors having principal conduction paths connected in series for current conduction between a first node and a ground input,
  - two or more second natural transistors of MOS type and of the same predetermined conductivity type as the one or more first transistors, each of the two or more second transistors being diode-connected and having a body terminal connected to a source terminal, the two or more second transistors having principal conduction paths connected in series for current conduction between the signal input and the first node, and
  - at least one first CMOS type logical inverter having an input connected to the first node and an output coupled to the signal output and being connected for power supply to a power supply input and to the ground input,
- a test circuit connected to the output of said detection circuit and responsive thereto for testing said logical type circuit.

9. A circuit in accordance with claim 8 further comprising a second logical inverter of CMOS type having an input connected to the output of said first inverter and an output connected to the signal output, and being connected for power supply to the power supply input and to the ground input.

10. A circuit in accordance with claim 8 wherein all the first and second transistors are the natural PMOS type and are provided in type-N wells all distinct from one another.

11. A circuit in accordance with claim 8 wherein said first inverter comprises a third transistor of NMOS type and a fourth transistor of PMOS type; and wherein a W:L ratio of said third transistor is much greater than a W:L ratio of said fourth transistor.

12. A circuit in accordance with claim 8 wherein said one or more first transistors are one, and said two or more second transistors are a number such that the first and second transistors start conduction only when a voltage at the signal input approaches the predetermined value while rising.

13. A circuit in accordance with claim 8 wherein said two or more second transistors are all the same; wherein a channel width of each second transistor is much greater than a channel width of each first transistor; and wherein a channel length of each second transistor is much less than a channel length of each first transistor.

14. A circuit in accordance with claim 9 wherein said second inverter comprises a fifth transistor of NMOS type and a sixth transistor of PMOS type; and wherein a W:L ratio of said fifth transistor is approximately equal to a W:L ratio of said sixth transistor and is suited for operation as an output stage.

* * * * *